United States Patent

Pinkham et al.

[11] Patent Number: 4,891,795
[45] Date of Patent: Jan. 2, 1990

[54] DUAL-PORT MEMORY HAVING PIPELINED SERIAL OUTPUT

[75] Inventors: Raymond Pinkham; Daniel F. Anderson, both of Missouri City, Tex.

[73] Assignee: Texas Instruments Incorporated, Dallas, Tex.

[21] Appl. No.: 334,970

[22] Filed: Apr. 7, 1989

Related U.S. Application Data

[60] Division of Ser. No. 114,887, Oct. 29, 1987, which is a continuation-in-part of Ser. No. 53,200, May 21, 1987, Pat. No. 4,817,058.

[51] Int. Cl.$^4$ .............................................. G11C 8/00
[52] U.S. Cl. ........................... 365/230.03; 365/230.05; 365/236
[58] Field of Search ...................... 365/230.03, 230.05, 365/219, 220, 221, 236

[56] References Cited

U.S. PATENT DOCUMENTS

4,633,441  12/1986  Ishimoto .......................... 365/230.05
4,817,058  3/1989   Pinkham ............................. 365/195

*Primary Examiner*—James W. Moffitt
*Attorney, Agent, or Firm*—Ferdinand M. Romano; Rodney M. Anderson; Melvin Sharp

[57] ABSTRACT

A dual-port memory which features a pipelined serial port is disclosed. The serial side of the dual-port memory contains a ripple counter which is broken between predetermined stages. The contents of the stages above the break are decoded to select a group of bits of the serial register for output, and the contents latched in a latch. In serial output, the contents of the stages below the break are decoded, so that responsive to the stages below the break reaching a certain value, the stages above the break are incremented and the incremented value decoded. Pass transistors between the register and the latch are turned off during such time as the incremented value is being decoded, so that the new value will not disturb the output. The latched output is selectively presented by a multiplexer which selects the latch bits responsive to the value of the stages below the break. Upon the value of the stages reaching its minimum value (i.e., the first bit of the next group), the pass transistors are enabled so that the contents corresponding to the incremented contents of the stages above the break are next presented at the output. Logic is provided so that during serial input the stages are not broken, to prevent the early incrementing of the counter prior to storage of the input data. Logic is also provided so that, initially after the counter is loaded with a new value, the first bits are output without being disturbed by an early incrementing of the counter stages above the break.

9 Claims, 5 Drawing Sheets

DUAL-PORT MEMORY HAVING PIPELINED SERIAL OUTPUT

This is a division of application Ser. No. 114,887, filed Oct. 29, 1987 which is a continuation-in-part of application Ser. No. 053,200 filed May 21, 1987, now U.S. Pat. No. 4,817,058.

This application is related to prior copending applications Ser. No. 081,926 and Ser. No. 081,948 both filed Aug. 5, 1987, and application Ser. No. 089,634 filed Aug. 26, 1987, all assigned to Texas Instruments Incorporated.

The subject invention is in the field of memory devices, specifically dual-port random access semiconductor memory devices as used in graphics applications.

BACKGROUND OF THE INVENTION

With the advent of less expensive semiconductor memory, modern computer and microcomputer systems have been able to use bit-mapped video displays for the output of data from the system. As is well known, a bit-mapped display requires a memory which can store at least one binary digit (bit) of information for each picture element (pixel) of the display device. Additional bits stored for each pixel provide the capability of the system to render complex images on the video display, such as multi-color images, and background and foreground images, such as a graphics background with textual information overlaid thereupon. The use of bit-mapped storage also allows for data processing operations to easily generate and modify the stored image.

Modern video display devices are often of the raster-scan type, where an electron gun traces horizontal lines across the display screen in order to generate the displayed pattern. In order for a displayed raster scan image to continue to be displayed on the video screen, the image must be refreshed at periodic intervals. A common refresh rate for the cathode ray tube video display devices is 1/60 of a second, since the refresh operation carried out at that speed is not noticeable to the human user of the system. However, as the number of pixels displayed on a screen increases, in order to increase the resolution of the displayed image, more and more bits of information must be accessed from the bit-mapped memory in the refresh interval. If the bit-mapped memory has but a single input and output port, the percentage of time during which data processing unit can access the bit-mapped memory decreases with the pixel size of the display if the refresh interval remains constant. In addition, the speed of the memory must increase, since more bits must be output during a fixed period of time.

Multiport random access memories have been developed which provide for high-speed output of data to the video display and also for increased accessibility of the memory contents to the data processing device. The multiport memories accomplish this by having a first port for random access and update of the memory by the data processing unit of the computer system and a second port for serial output of the memory contents to the video display independent from and asynchronous with the first port, thereby allowing access to the memory contents during output of data to the video display terminal. Examples of multiport random access memories are described in U.S. Pat. No. 4,562,435 (issued Dec. 31, 1985), U.S. Pat. No. 4,639,890 (issued Jan. 27, 1987), and U.S. Pat. No. 4,636,986 (issued Jan. 13, 1987), all assigned to Texas Instruments Incorporated.

In each of these prior multiport memories, data is shifted from some or all of the memory cells in a row of the random access array into a register, during a special transfer cycle. Serial output is then accomplished from the register in a manner which is independent from and asynchronous with the operation of the random access of data in the array. Serial input capability can also be provided in such devices, with another type of transfer cycle capable of shifting the contents of the serial register into a selected row of the random access array.

The serial "side" of these prior multiport memories has been constructed according to various architectures. For example, the device described in said U.S. Pat. No. 4,639,890 has a shift register as the register on the serial side, with the serial output beginning from a selected cell in the shift register from taps included therewith. Each serial clock pulse shifts the data along the shift register, with the output coming from the tapped shift register cell, to provide a serial stream of data. Serial input can of course be accomplished by providing input data to the tap point and shifting the input data stream along the shift register. If fewer tap points than cells are provided for the shift register in this device, however, flexibility of the starting point for serial output (and input) is compromised.

Greater flexibility for the starting point of serial input/output is provided by the device described in said U.S. Pat. No. 4,636,986, where a non-shifting register contains the data to be serially output. In this arrangement, a counter stores an address from which serial output is to occur, and a decoder acts responsive to the counter to select the one of the register cells from which serial output, for example, is to occur. Each pulse of the serial clock signal causes the counter to increment its stored value, with the decoder enabling the next register cell in sequence accordingly, in order to provide the serial data stream. Serial input is similarly accomplished, with the serial clock incrementing the register cell location receiving the serial input bit.

While the use of the counter/decoder architecture provides for increased flexibility with respect to the starting points for serial input and output, the counter and decoder circuits required to select, and to update the selection of, the serial register bit include built-in delays. For example, in order to increment the serial register position, the counter must increment its contents responsive to the serial clock pulse, and the decoder must again decode the output of the counter before the next serial register cell is selected. Such delays, while they may be minimized by design and manufacturing techniques, are inherent in this particular architecture.

It is therefore an object of this invention to provide a pipeline architecture for the serial side of a dual-port memory, in order to improve the speed of serial output therefrom.

It is a further object of this invention to provide such a pipeline where the pipeline is disabled for purposes of serial input, so that serial input data is stored in the proper location in the serial register.

It is a further object of this invention to disable the pipeline for output during selection of another serial register location.

Other objects and advantages of this invention will become apparent to those of ordinary skill in the art having reference to the following description, along with the accompanying drawings.

SUMMARY OF THE INVENTION

The invention may be incorporated into a dual-port random access memory having a serial register for serial output of data independent from and asynchronous with random access to the memory array. A counter and decoder selects a group of register cells from which serial output is to come, and the bits of data in the group are latched and applied to a multiplexer. The counter is responsive to increment its contents upon each period of the serial clock signal. The least significant bit or bits of the counter are decoded to select the one of the group of bits to be applied to the serial output terminal, avoiding decoding of the entire contents of the counter for each serial bit. For purposes of serial output, the more significant bits of the counter are updated early, so that the decoder selects the next group of bits to be output during such time as the last bit of the prior group is being output. In serial input mode, the more significant bits of the counter may be incremented normally rather than by the early update used in serial output, so that serial input data received by the serial register is stored in the desired register location. The pipeline may also be defeated when a new serial register address is selected, so that the initial output is not disturbed by the early incrementing of the counter.

DETAILED DESCRIPTION OF THE PREFERRED EMBODIMENT

Figure 1:
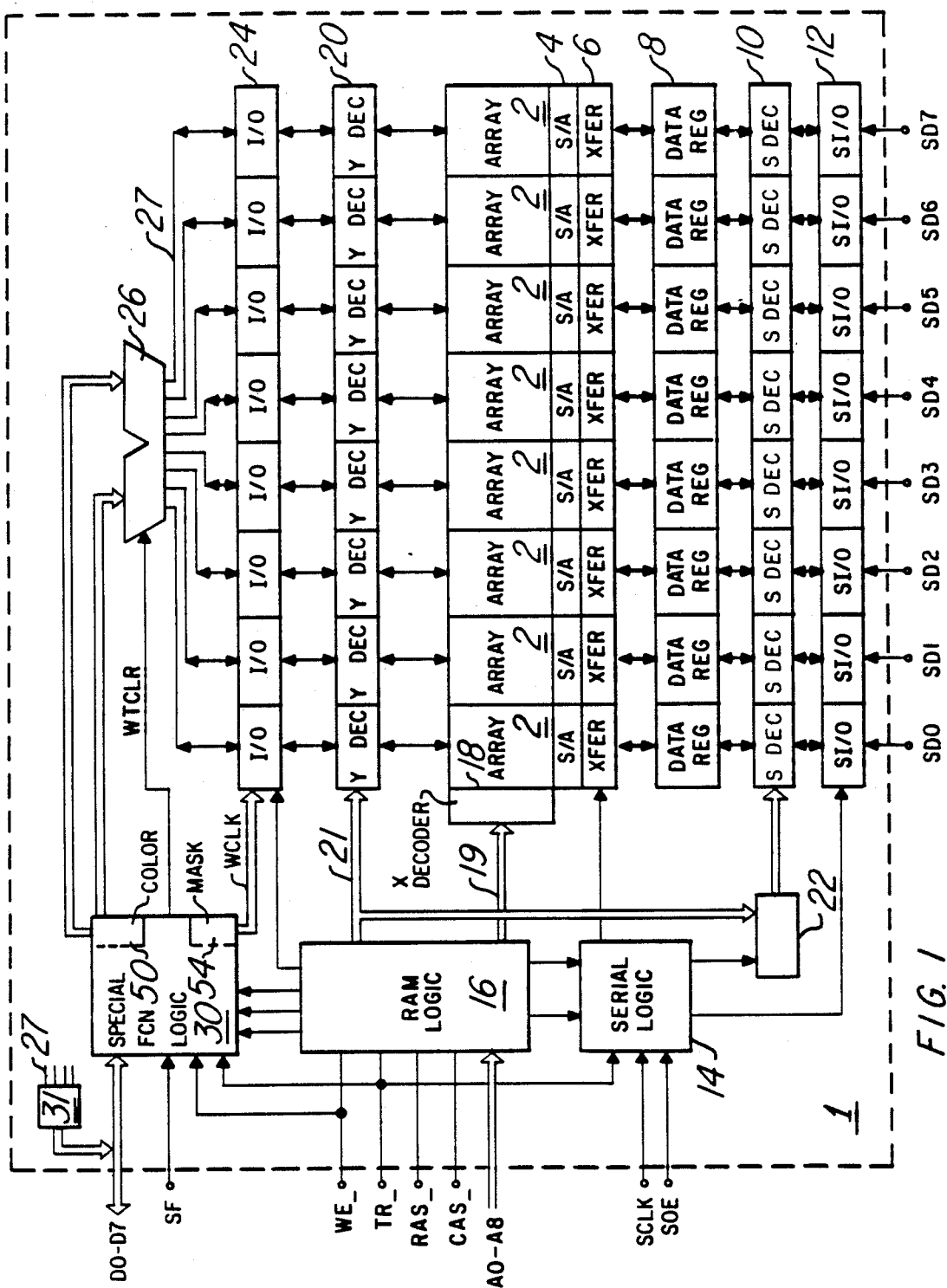
FIG. 1 illustrates a schematic block diagram of the preferred embodiment of a dual-port memory constructed according to the invention.

Referring now to FIG. 1, a functional block diagram of a dual port memory 1 constructed according to the instant invention, is illustrated. Similarly as the memory of said U.S. Pat. No. 4,636,986, incorporated herein by this reference, dual-port memory 1 receives address signals on lines A0 through A8, clock signals RAS__, CAS__ and SCLK, write enable signal WE__, transfer enable signal TR__, and serial output enable signal SOE__. It should be noted that only a single column address strobe CAS__ is received and utilized by dual-port memory 1 as the write mask feature is included therein. Dual-port memory 1 has eight random access input/output lines D0 through D7, rather than the four such input/output terminals of the memory of said U.S. Pat. No. 4,636,986; the invention to be described herein will of course be applicable to either organization, or other organizations of a dual-port memory. Accordingly, dual-port memory 1 contains eight arrays 2, each of which in this embodiment contain 128 kbits of storage organized in 512 rows and 256 columns, totaling 1 Mbit storage. Associated with each of the arrays 2 are sense amplifier banks 4, containing 256 sense amplifiers as are well known in the art for the sensing, restoring and writing of data from and into the dynamic memory cells of the arrays 2.

On the random access side, RAM logic 16 performs the address latching and decoding as performed in the memory of said U.S. Pat. No. 4,636,986, and therefore receives the row address strobe and column address strobe signals RAS__ and CAS__, respectively, and address lines A0 through A8. The row address value appearing on address lines A0 through A8 are latched by the row address strobe signal RAS__, and are communicated to X decoder 18 via lines 19, so that X decoder 18 can select a row in each of the arrays 2 responsive to the latched row address value on lines 19. Similarly, the column address value appearing on address lines A0 through A7 (the column address signal on line A8 being unnecessary to select one of 256 columns) are latched by RAM logic 16 responsive to column address strobe signal CAS__, and the latched column address value is communicated from RAM logic 16 to Y decoders 20 by way of lines 21, each of the eight arrays 2 having a Y decoder 20 associated therewith. Each of the Y decoders 20 are therefore operable to connect the desired bit line within its associated array 2 and which is corresponding to the latched column address value to its associated input/output buffer 24.

In addition to functions described in said U.S. Pat. No. 4,636,986, dual-port memory 1 has additional control over the random access data input function, such additional control performed by special function logic 30. Each of the eight input/output buffers 24 are connected to the data terminals D0 through D7 by way of multiplexer 26. For purposes of random access read, the output of input/output buffers 24 are received by output drive circuitry 31 and thereby communicated to the terminals of lines D0 through D7. Output drive circuitry 31 is constructed in any one of a number of well known configurations, and is enabled from the external signal on line TR__ under the control of RAM logic 16. For purposes of random access write, of course, output drive circuitry 31 will be disabled by RAM logic 16 to prevent a data conflict.

During a write cycle, line WTCLR from special function logic 30 controls multiplexer 26 to select either the data value appearing at data terminals D0 through D7 or the contents of a color register 50 within special function logic 30 to input/output buffers 24 via lines 27, depending upon the function selected by the user. Special function logic 30 is also operable to control the write mask feature similar to that described above for the memory of said U.S. Pat. No. 4,636,986; special function logic 30 is operable, however, to store the value of the write mask in a write mask register 54 so that the write mask value can operate for a plurality of cycles, and so that the write mask value may be recalled many cycles after it is initially loaded, and after intervening cycles of non-masked random access writes. The contents of write mask register 54, or a non-masked write signal, as desired, are applied by special function logic 30 to input/output buffers 24 by way of lines WCLK, as described in said application Ser. No. 053,200.

Looking to the serial side of dual-port memory 1, transfer gates 6 are connected to each of the bit lines in the arrays 2, similarly as in the dual-port memory of said U.S. Pat. No. 4,636,986, for transferring data from the arrays 2 into data registers 8, or vice versa. In this example, data registers 8 are 256-bit registers, so 256 bits of data are transferred by each bank of transfer gates 6; i.e., in each transfer cycle, 2048 bits of data are transferred. Serial logic 14 receives the serial clock signal on line SCLK, a serial enable signal on line SOE_ and a transfer signal on line TR_, as well as signals from RAM logic 16, so that the transfer of data may be effected at the proper time, as in the memory of said U.S. Pat. No. 4,636,986.

Counter 22 which, as will be described in greater detail below, can also contain a pre-decoder, selects a bit in each of data registers 8 to or from which serial input/output is to begin. Accordingly, counter 22 receives the latched column address signal from RAM logic 16 on lines 21 which, as for the memory of said U.S. Pat. No. 4,636,986, selects the serial position at which serial input or output is to begin. Serial logic 14 controls counter 22 to load the latched column address value in a transfer cycle, and also provides a signal to counter 22 for each cycle of the clock signal on line SCLK so that the value stored in counter 22 is incremented for each serial cycle. Counter 22 further contains, in this embodiment, a predecoder for partially decoding the value stored therein. Each of serial decoders (or pointers) 10, one such serial decoder 10 associated with each of the data registers 8, receives the partially decoded contents of counter 22. The contents of data registers 8 are not shifted therewithin in each serial cycle as in the memory of said U.S. Pat. No. 4,636,986, but serial decoder 10 instead points to a bit therewithin, with the bit portion incrementing with each cycle of the clock signal on line SCLK incrementing the contents of counter 22. The contents of the bit in each of data registers 8 which is pointed to by the associated one of serial decoders 10 is connected for input and output purposes to the associated one of serial input/output buffers 12, one of said serial input/output buffers being associated with each of the eight arrays 2 and data registers 8. Serial input/output buffers 12 communicate data between the associated serial input/output terminal SD0 through SD7 and the bit of its associated data register 8 which is pointed to by serial decoder 10.

Terminal SOE_ receives a signal during various stages of a memory cycle in order to place serial input/output terminals SD0 through SD7 into either serial input mode or serial output mode. In the device of FIG. 1, the execution of a memory-to-register transfer cycle automatically places the serial side in serial output mode. In serial output mode, a high logic level on line SOE_ disables serial output, and a low logic level on line SOE_ enables serial output, so that the signals received by terminal SOE_ are utilized for output enable control in a manner well known in the art.

In order to switch the serial side of dual-port memory 1 from serial read mode to serial write mode, a pseudo-transfer cycle is performed. The signals provided at terminals RAS_, WE_, TR_, and SOE_ are used to perform and set up this cycle, as well as to perform the transfer operations. Referring to Table 1, the truth table for these signals at the time of the high-to-low transition of RAS_ is illustrated for the execution of a transfer in either direction, and for the pseudo-transfer cycle which sets up the serial input mode.

TABLE 1

| TR_ | WE_ | SOE_ | Cycle |
|---|---|---|---|
| 0 | 0 | 0 | Register-to-memory transfer |
| 0 | 0 | 1 | Set-up serial input mode |
| 0 | 1 | X | Memory-to-register transfer; |

TABLE 1-continued

| TR_ | WE_ | SOE_ | Cycle |
|---|---|---|---|
| | | | set-up serial output mode |

It should be noted that the value of the row address signal on lines A0 through A8 at the time of the RAS_ transition is used to select the row to, or from, which the register transfer is to occur. In the pseudo-transfer cycle setting up the serial input mode, memory cells in the addressed row are refreshed. Once the serial input mode, a high logic state at terminal SOE_ will disable serial input at terminals SD0 through SD7, and a low logic state at terminal SOE_ will enable serial input thereat. Accordingly, in the serial input mode terminal SOE_ performs an input enable function.

Figure 2:
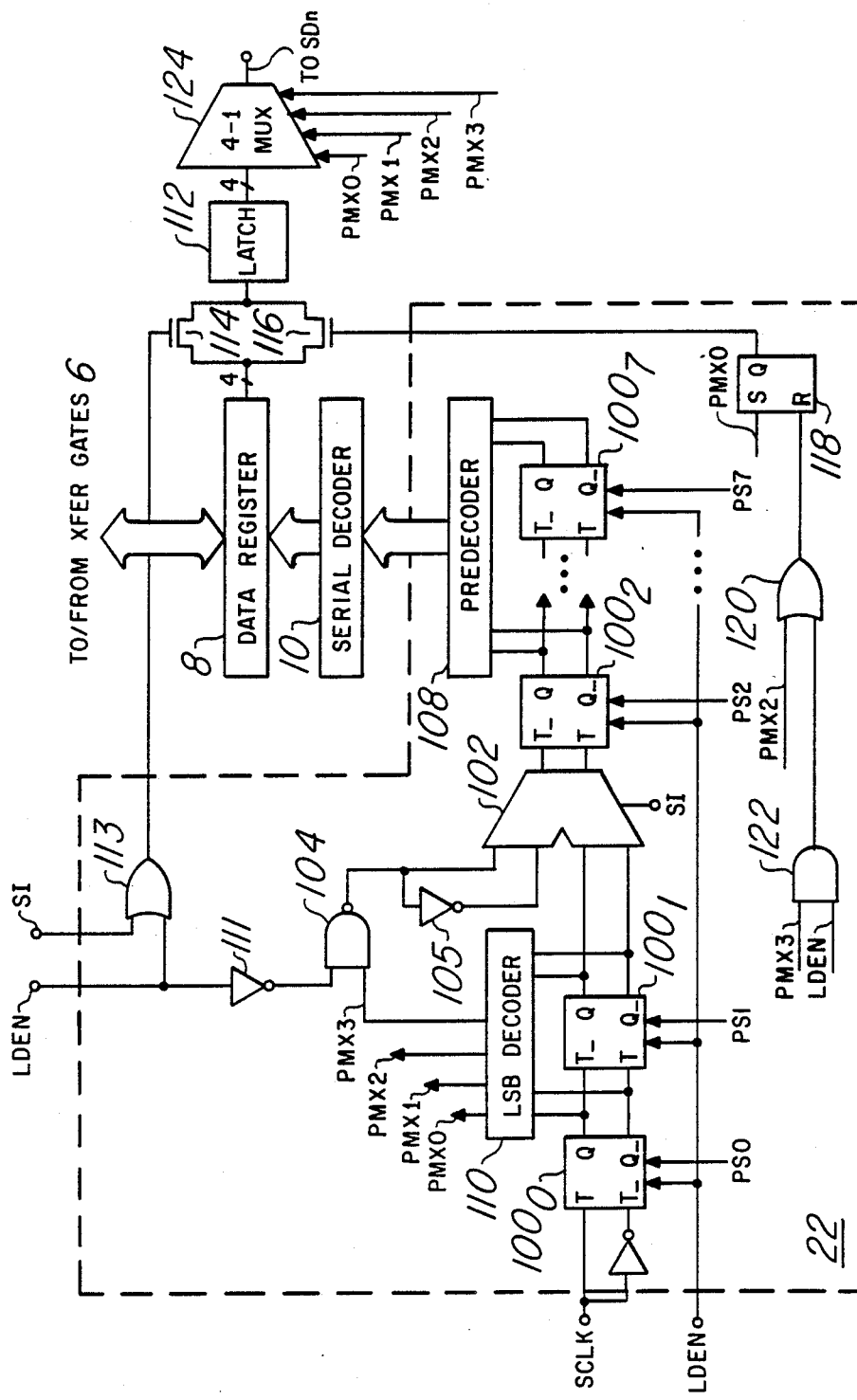
FIG. 2 is an electrical diagram, in schematic form, of a first embodiment of the serial input and output circuitry of the memory of FIG. 1.

Referring now to FIG. 2, the construction of counter 22 and serial decoders 10, and the operation thereof in conjunction with data registers 8, according to a first preferred embodiment of the invention, will be described in further detail. Relative to serial decoders 10 and data registers 8, the following description will be as associated with one of the serial input/output terminals SD0 through SD7; it is of course understood that such circuitry will be replicated for each of the other serial input/output terminals SD0 through SD7.

Counter 22 is a ripple counter which includes eight pre-settable T-type latches $100_n$ for storing the address value of the one of 256 bits of data register 8 which is to be output (or to which input data is to be stored). Each of latches $100_n$ preferably have both true and complement T (toggle) inputs and true and complement Q outputs. Each of latches $100_n$ may be preset by a signal lines PS0 through PS7 from RAM logic 16, in conjunction with a load enable signal on line LDEN so that the initial location in data register 8 for serial input/output can be loaded thereinto. As mentioned above, this initial value is selected by way of the column address signal on lines A0 through A8 during a transfer cycle. After preset, line LDEN returns to an inactive state, disabling latches $100_n$ from responding to the logic state of lines PS0 through PS7.

Latches $100_n$ are T-type in that the stored contents therein will toggle upon receipt of a low-to-high transition at its T input (i.e., a high-to-low transition at its T_ input). Latch $100_0$, which stores the least significant bit of counter 22, toggles its contents responsive to serial clock signals at terminal SCLK. Latch $100_1$, and latches $100_3$ through $100_7$, receive the Q output from the previous latch at its T_ input; accordingly, upon one of latches $100_0$, and $100_2$ through $100_6$ changing its contents from a one to a zero, the contents of the next most significant one of latches $100_n$ will be toggled so as to effect a carry, thereby correctly incrementing the value stored in counter 22. Connected between the Q and Q_ outputs of latch $100_1$ and the T and T_ inputs of latch $100_2$ is multiplexer 102, which selects either the output of latch $100_1$, or the output of NAND gate 104 to latch $100_2$. Multiplexer 102 is controlled by signal SI from serial logic 14, signal SI indicating whether the serial side of dual-port memory 1 is in serial input or serial output mode, as selected according to Table 1 above. As will be described in greater detail below, in serial output mode the true and complement output of NAND gate 104 is connected to the T and T_ inputs of latch $100_2$ to anticipate the carry from latch $100_1$ to latch $100_2$, in order to keep the serial output data pipeline filled. In serial input mode, the complement and true output of latch $100_1$ will be connected to the T and T_ inputs of latch $100_2$ in the same manner as the interconnection of the other latches $100_n$ in counter 22.

The least significant two bits of the stored address value, stored in latches $100_0$ and $100_1$, are decoded by LSB decoder 110 within counter 22, with one of the four lines PMX0 through PMX3 driven to a high logic level responsive to the value stored in latches $100_0$ to $100_1$. *For example, line PMXO will be driven high by LSB decoder* 100 *responsive to latches* $100_0$ *and* $100_1$ storing the value 00, line PMX1 will be high responsive to the value 01 stored therein, and so on. Accordingly, the high logic levels driven on lines PMX0 through PMX3 will be non-overlapping in time, as only one will be active to the exclusion of the others. Lines PMX0 through PMX3 control multiplexer 124 to select one of the four bits of data register 8 selected by predecoder 108 and serial decoder 10 described below, for each of data registers 8 within dual-port memory 1.

Line PMX3, which carries a high logic level only when the contents of latches $100_0$ and $100_1$ contain the value 11, is connected to a first input of NAND gate 104. The second input of NAND gate 104 receives the logical complement (via inverter 111) of line LDEN; line LDEN enables, when in a high logic state, the loading of a new value into latches $100_n$ from lines PS0 through PS7. Once the new value is loaded, and serial output or input is to begin, line LDEN will be at a low logic level, thereby allowing the logic state of line PMX3 to control the output of NAND gate 104. The output of NAND gate 104 is presented, both true and complement (inverted by inverter 105), to multiplexer 102. In the serial output mode, multiplexer 102 connects the output of NAND gate 104 (not inverted) to input T, and the output of inverter 105 to input T_, of latch $100_2$. Accordingly, in serial output mode latch $100_2$ will toggle when the contents of latches $100_0$ and $100_1$ increment to the value 11, rather than when the contents of latches $100_0$ and $100_1$ increment from the value 11 to the value 00 (which is the case with the Q and Q_ outputs of latch $100_1$ connected to the T_ and T inputs of latch $100_2$).

The five most significant bits of the contents of counter 22, stored in latches $100_2$ through $100_7$, are decoded by predecoder 108 contained within counter 22. Since the address stored in counter 22 is applied to each of the eight data registers 8 within dual-port memory 1, it is efficient to perform at least a partial decoding of this address within counter 22 rather than to fully decode the same value at eight locations within the memory. The number of outputs from predecoder 108 will of course vary with the amount of predecoding which is desired to be done within counter 22; for example, predecoder 108 can provide at its output the four-to-sixteen decoding of the output of latches $100_4$ through $100_7$, with the output states of latches $100_2$ and $100_3$ passing through predecoder 108. Serial decoder 10 associated with each of data registers 8 is thus operable to select four of the 256 locations in its associated data register 8 responsive to the output from predecoder 108. If desired, intermediate output buffers may be provided to buffer data in and out of the selected four locations of data register 8, as is well known in the art. Such intermediate output buffers are not expressly shown in FIG. 2 for purposes of clarity.

For serial output, the contents of the four locations of data register 8 selected by serial decoder 10 are connected to four bit latch 112 by way of pass transistors 114, and by way of pass transistors 116. Only single pass transistors 114 and 116 are illustrated in FIG. 2, for the sake of clarity, but of course a pass transistor 114 in parallel with a pass transistor 116 is provided for each of the four data lines between data register 8 and latch 112. Bidirectional tristate buffers may of course also be used in place of pass transistors 114 and 116, as desired. The gates of pass transistors 114 are controlled by the output of OR gate 113, which has lines SI and LDEN at its inputs. Accordingly, a low logic level on line LDEN during serial output mode (line SI being low) will make transistors 114 non-conductive. Except during the time that a new value is being loaded into latches $100_n$, as will be further explained below, line LDEN is at such a low state, allowing pass transistors 116 to control the communication of date between data register 8 and latch 112 during serial output. The gates of pass transistors 116 are controlled by the Q output of an RS latch 118, which has its set input controlled by line PMX0. The reset input to latch 118 is controlled by the output of OR gate 120, which has a first input connected to line PMX2, and which has its second input connected to the output of AND gate 122. AND gate 122 has its inputs connected to lines PMX3 and LDEN. During serial input, the high state of line SI causes pass transistors 114 to communicate data between latch 112 and data register 8, regardless of the state of latch 118.

Latch 112 is a four bit latch, which stores data to be communicated between data register 8 (via either pass transistors 11 or 116) and 4-to-1 multiplexer 124. Multiplexer 124 is controlled by lines PMX0 through PMX3, which indicate which of the four bits of latch 112 is being output to (or which of the four bits of latch 112 is to store the input data from) serial input/output terminal $SD_n$. The necessary input and output buffers, constructed in a manner well known in the art, are connected between the output of multiplexer 124 and serial input/output terminal $SD_n$.

Figure 3:
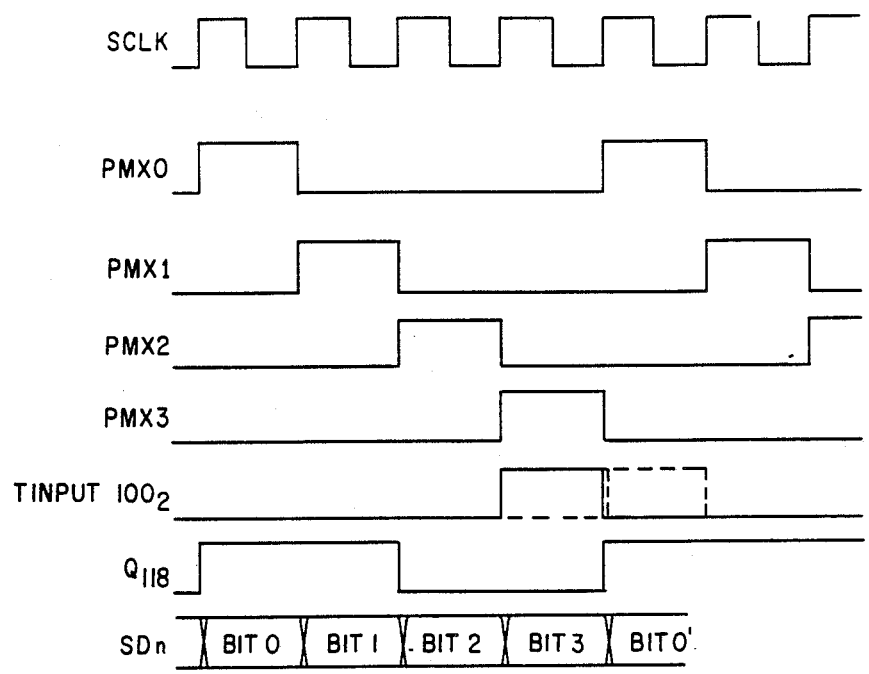
FIG. 3 is a timing diagram illustrating the operation of serial output from the circuitry of FIG. 2.

Referring now to FIG. 3, the operation of the circuitry of FIG. 2 in the serial output mode will be described. The first example of such operation will begin from the initial condition that the contents of latches $100_0$ and $100_1$ have incremented to the value 00 from a prior address; an example of the operation of the circuit in the case of a new address being loaded into counter 22 will be given below. Accordingly, line LDEN will be at a logic low level throughout this example, making pass transistors 114 non-conductive, and forcing the output of AND gate 122 to a low logic level. In addition, line SI at the control input to multiplexer 102 will be selecting the output of NAND gate 104 to be connected to the T and T_ inputs of latch $100_2$. The value 00 in latches $100_0$ and $100_1$ generates a high logic level on line PMX0 from LSB decoder 110, and a low level on lines PMX1, PMX and PMX2, as shown in FIG. 3. This high level on line PMX0 sets RS latch 118 (as shown by line $Q_{118}$ in FIG. 3), connecting data register 8 to latch 112 to load the contents of the four locations addressed by the contents of latches $100_2$ through $100_7$. The high logic level on line PMX0 will cause multiplexer 124 to select the corresponding one of the four bits of latch 112 for output to serial input/output terminal $SD_n$ (BIT 0 shown in FIG. 3).

Upon the next low-to-high transition of the serial clock signal at terminal SCLK, the state of latch $100_0$ will toggle from 0 to 1. Since the Q_ output of latch $100_0$ is connected to the T input of latch $100_1$, the T input of latch $100_1$ will see a high-to-low transition, so latch $100^1$ will not toggle at this time. Line PMX1 from LSB decoder 110 will go high and line PMX0 therefrom will return low, responsive to the change of value of latch $100_0$. Multiplexer 124 will select the second one of the four bits stored in latch 112 (shown as BIT 1) for output to serial input/output terminal $SD_n$, accordingly.

Upon the next low-to-high transition of the serial clock signal at terminal SCLK, the contents of latches $100_0$ and $100_1$ will be a value 10. Accordingly, LSB decoder 110 will drive line PMX2 to a high level, and will return line PMX1 to its low state. The low-to-high transition on line PMX2 will generate a low-to-high transition at the output of OR gate 120, and will reset the output of RS latch 118 to a low level (as shown in FIG. 3). Since the contents of latch 112 contain the third and fourth bits to be output at serial input/output terminal $SD_n$, no data is lost by the isolation of data register 8 from latch 112, and the isolation allows a new set of four bits to be selected in data register 8 without disturbing the contents of latch 112. The third bit stored in latch 112 (i.e., BIT 2 of FIG. 3) is selected for output by multiplexer 124 responsive to line PMX2.

The next period of the serial clock signal at terminal SCLK causes the contents of latches $100_0$ and $100_1$ to be incremented to the value 11, in turn causing LSB decoder to assert line PMX3 and to pull line PMX2 low. The output of NAND gate 104 goes from a high level to a low level, accordingly. Since line SI has controlled multiplexer 102 to select the output of NAND gate 104 for application to the T and T— inputs of latch $100_2$, the T input of latch $100_2$ sees a low-to-high transition, causing it to change states (see line T INPUT $100_2$ of FIG. 3). This toggling of latch $100_2$ increments the value stored in latches $100_2$ through $100_7$, and predecoder 108 and serial decoder 10 select the next group of four bits in data register 8 responsive thereto. However, since the output of RS latch 118 is low, data register 8 is isolated from latch 112, so that the selection of the next group of four bits does not disturb the data stored in latch 112 which is being output at serial input/output terminal $SD_n$. The fourth bit of latch 112 is selected for output by multiplexer 124 responsive to line PMX3 being high, as shown in FIG. 3 as BIT 3. This fourth bit is of course from the prior set of four bits of data register 8 selected by serial decoder 10.

The next low-to-high transition of the serial clock signal at terminal SCLK increments the contents of latches $100_0$ and $100_1$ to the value 00. As described above, this sets the output of RS latch 118 so that pass transistor 116 conducts the four selected bits of data register 8 to latch 112, for output therefrom. Line PMX0 is asserted as before, selecting the first of the four bits of latch 112 for output, shown in FIG. 3 as BIT 0'.

It should be apparent from the above description that serial output of data from dual-port memory 1 occurs for each incremental location in data register 8 without requiring that the entire contents of counter 22 be decoded each time. For the second through fourth bits stored in latch 112, the only operation required is the decoding of the two least significant bits stored in latches $100_0$ and $100_1$ and the selection of a different data bit of latch 112 by multiplexer 124.

Referring to line T INPUT $100_2$ of FIG. 3, the dashed lines indicate the time at which the T input to latch $100_2$ would be toggled without the pipeline feature. With the Q and Q— outputs of latch $100_1$ connected to the T— and T inputs of latch $100_2$, in the same manner as the remainder of the latches $100_n$, latch $100_2$ would toggle upon the contents of latches $100_0$ and $100_1$ incrementing from its maximum value 11 to its overflow value 00. The pipeline feature of the circuitry of FIG. 2 thus allows the most significant bits of the data register address to be decoded a serial clock cycle ahead of time, so that by the time that the first bit of the next set of four bits (in the above example) is desired for output, the value stored by the five most significant bits of counter 22 has been incremented and decoded. This architecture thus provides a faster serial output stream than prior serial port architectures which required decoding the contents of counter 22 after incrementing in each serial clock cycle.

The early incrementing of the six most significant bits of counter 22 presents a problem, however, in the event that serial input is desired. For example, if the contents of latch $100_2$ are toggled during serial input to the fourth bit of the prior group of four (line PMX3 high), the contents of the four bits stored in latch 112 would be stored in an incorrect location in data register 8 (i.e., one group of four bits ahead of that originally selected). Accordingly, the pipeline is preferably defeated for purposes of serial input. This is accomplished by way of line SI selecting the Q and Q— outputs of latch $100_1$ to be connected to the T— and T inputs of latch $100_2$, rather than connecting the true and complement output of NAND gate 104 thereto. In this way, for serial input the signal seen by the T input of latch $100_2$ will be as shown by the dashed lines in FIG. 3, so that the contents of latches $100_2$ through $100_7$ will be incremented and decoded during serial input to the first bit of the selected group of four. This ensures that serial input data received at serial input/output terminal $SD_n$ via latch 112 will be written to the desired locations in data register 8.

In the event that the address of a new starting location in data register 8 is to be loaded into latches $100_0$ through $100_7$ via lines PS0 through PS7, respectively, misaddressing may occur if the new address contains the value 11 in its two least significant bits. Such a problem could occur by line PMX3 generated by LSB decoder 108 responsive to a 11 value in latches $100_0$ and $100_1$ toggling the contents of latch $100_2$ immediately after the state of line PS2 is latched thereinto. For example, if the desired address value were 0000 0011$_2$, the undesired toggling of latch $100_2$ would cause the address value decoded by predecoder 108 and serial decoder 110 to be 0000 0111$_2$, four bits ahead of the desired location of data register 8. It therefore desirable that the initial decoding of the first group of four bits be done according to the actual value of the address, without a 11 value in the two least significant bits "prefetching" the next group of four bits.

The circuitry illustrated in FIG. 2 provides the capability for a new address to be loaded into counter 22 while preventing an undesired incrementing of the six most significant bits stored in latches $100_2$ through $100_7$ until the first group of four bits are loaded into latch 112 for output. A high logic level on line LDEN enables latches $100_n$ to be loaded with the logic states on lines PS0 through PS7. This high logic level is communicated via inverter 111 to an input of NAND gate 104 so that the output of NAND gate 104 is prevented from toggling regardless of the state of line PMX3. The high logic state on line LDEN turns on pass transistors 114, so that the four bits corresponding to the value stored in latches $100_2$ through $100_7$ will be communicated to latch 112 immediately after decoding. As before, the output of LSB decoder 110 will control multiplexer 124 to select the one of four bits in latch 112 for output at serial input/output terminal $SD_n$.

Once line LDEN is returned to a low state, pass transistors 114 will be turned off, and the state of line PMX3 will again toggle latch $100_2$ to change state during the selection of the fourth bit in latch 112. This toggling will, as described above, cause predecoder 108 and serial decoder 10 to select the next group of four bits for output during the output of the fourth bit from the prior group of four. As described above, a high logic state on line PMX2 resets RS latch 118 so that latch 112 is isolated from data register 8 while the next group of four bits is being selected. AND gate 122 and OR gate 120 are provided so that latch 112 is isolated in the event that the two least significant bits of the loaded address are 11 (i.e., no PMX2 signal to reset RS latch 118). If both line LDEN and line PMX3 are at a high logic state simultaneously (i.e., the loaded address ends in 11), a high level will be presented to OR gate 120 by AND gate 122, and RS latch 118 will be reset accordingly, turning off pass transistors 116. Since line LDEN has turned on pass transistors 114, and has disabled the toggle of NAND gate 104, the four bits selected by the new initial address are loaded into latch 112 through pass transistors 114, and the fourth bit thereof is selected by multiplexer 124 responsive to the high logic state on line PMX3 from LSB decoder 110.

Upon the subsequent return of line LDEN to a low logic state while line PMX3 is high, pass transistors 114 will turn off, and latch 112 will be isolated from data register 8 due to the rest of latch 118 by the operation of OR gate 120 and AND gate 122. Also upon the subsequent return of line LDEN to a low logic level, the output of NAND gate 104 will go to a low state (line PMX3 being high), toggling the T input of latch $100_2$ and incrementing the count stored in latches $100_2$ through $100_7$. This allows predecoder 108 and serial decoder 10 to decode the incremented count, and to select the next corresponding group of four bits in data register 8. As before, upon the next cycle of the serial clock signal at terminal SCLK, line PMX0 will go to a high level upon the toggling of latches $100_0$ and $100_1$, setting RS latch 118 and connecting the selected four data bits of data register 8 to latch 112 for output therefrom.

Figure 4:
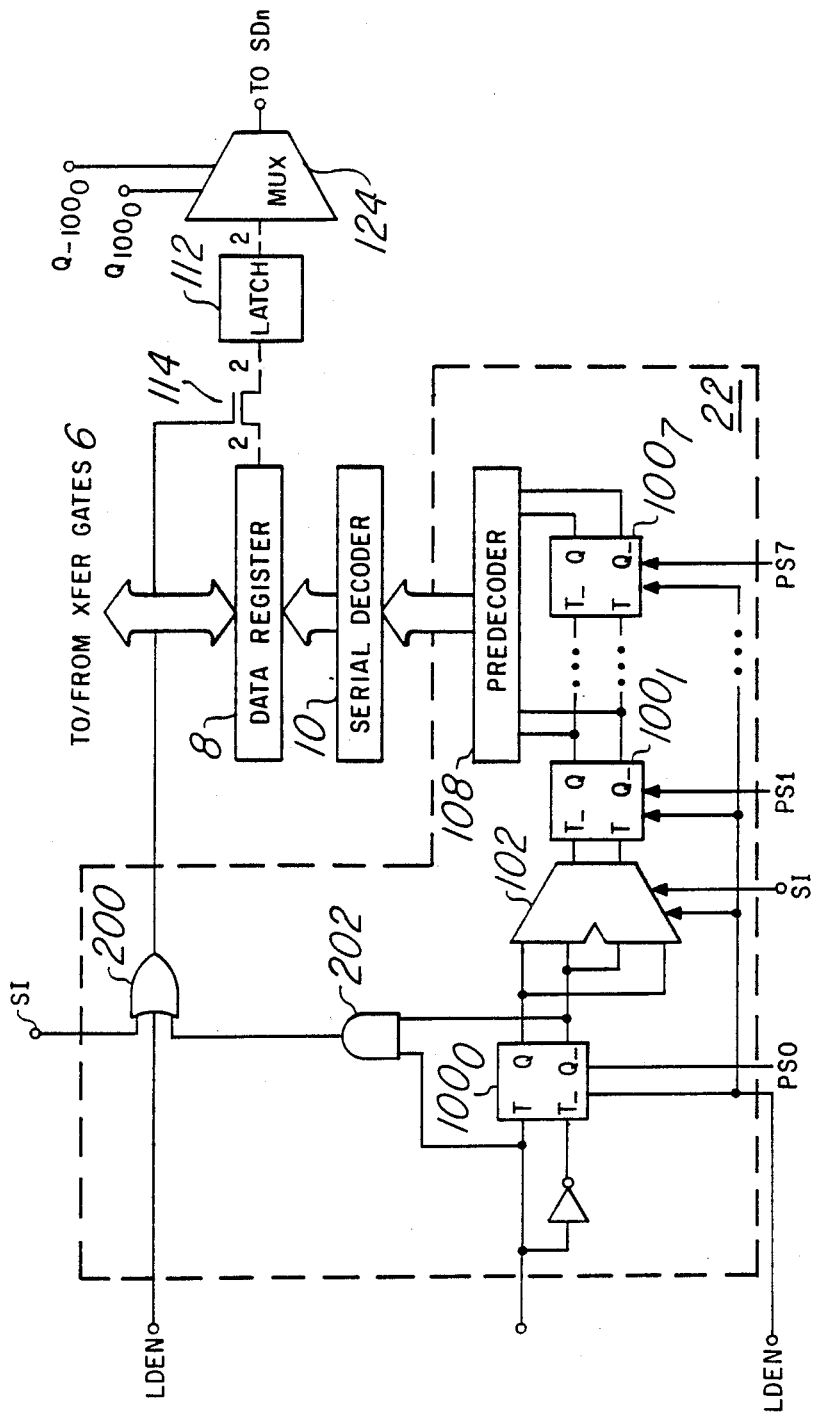
FIG. 4 is an electrical diagram, in schematic form, of a second embodiment of the serial input and output circuitry of the memory of FIG. 1.

Referring now to FIG. 4, an alternative preferred embodiment of the invention will be described. The elements of the embodiment illustrated in FIG. 4 which perform functions as elements in the embodiment of FIG. 2 will be referred to by the same reference numerals. The embodiment of FIG. 4 performs the pipelining according to the state of the least significant bit of the address, stored in latch $100_0$. Accordingly, the seven most significant bits of the address, stored by latches $100_1$ through $100_7$, are decoded by predecoder 108 and serial decoder 10, to select two of the 256 bits in data register 8.

Multiplexer 102 in serial output mode connects the Q and Q— outputs of latch $100_0$ to the T and T— inputs of latch $100_1$, respectively, so that latch $100_1$ is toggled responsive to the contents of latch $100_0$ switching from 0 to 1, one cycle of the serial clock signal ahead of the actual count. This allows predecoder 108 and serial decoder 10 to decode the incremented contents of the seven most significant bits of the stored address during the output of the second bit of the prior group of two bits. In serial input mode, multiplexer 102 reverses the connection between latches $100_0$ and $100_1$ so that the Q and Q— outputs of latch $100_0$ are connected to the T— and T inputs of latch $100_1$, respectively, in the same manner as the connection of the other latches $100_1$ through $100_7$. The signal on line SI controls multiplexer 102 accordingly, for selection of the pipeline connection in serial output mode. Line LDEN is also provided as a control input to multiplexer 102, so that the serial input mode connection of the Q and Q— outputs of latch $100_0$ are connected to the T— and T inputs of latch $100_1$, respectively, is selected during the loading of latches $100_0$ through $100_7$ from lines PS0 through PS7. Latch 112 is connected to a two-to-one multiplexer 124 which has its control inputs connected to the Q and Q— outputs of latch $100_0$, for selecting between the two bits of information stored therein for communication with serial input/output terminal $SD_n$.

Pass transistors 114 are connected between data register 8 and latch 112, for communicating two bits of data therebetween. As in FIG. 2, only a single pass transistor 114 is illustrated in FIG. 4 for purposes of clarity, but of course two pass transistors 114 will be used for each of the two data lines; a tristate buffer may of course also be used in its place. The gates of pass transistors 114 are connected to the output of OR gate 200. OR gate 200 has three inputs, one of which is connected to the output of AND gate 202, with the two other inputs connected to lines LDEN and SI. In this way, pass transistors 114 will be conductive either in serial input mode (line SI at a high logic level), during the loading of latches $100_0$ through $100_7$ (line LDEN at a high logic level), or during such time as the serial clock signal on line SCLK and the Q— output of latch $100_0$ are both high.

Figure 5:
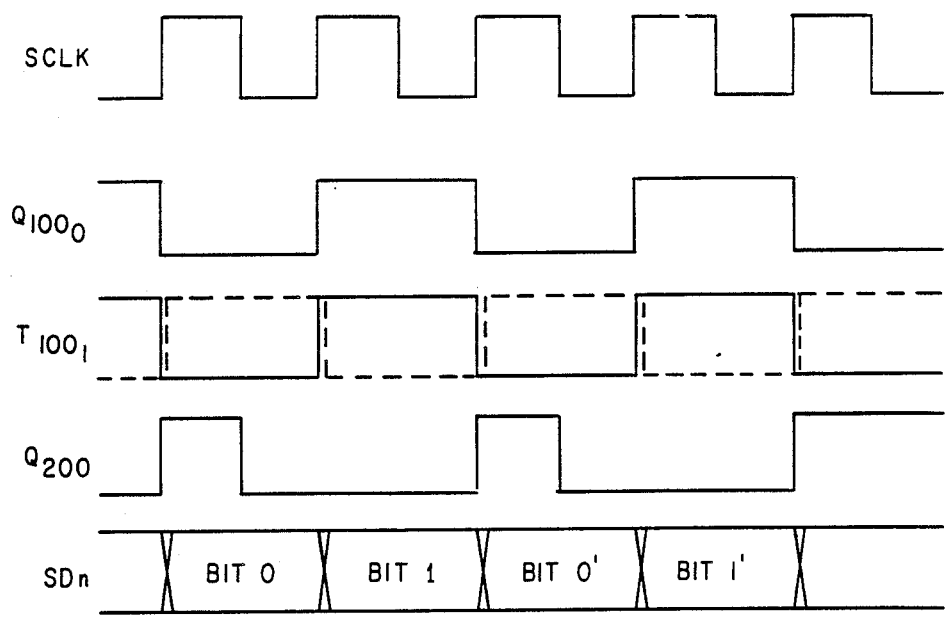
FIG. 5 is a timing diagram illustrating the operation of serial output from the circuitry of FIG. 4.

Referring now to FIG. 5, the operation of the alternative preferred embodiment of FIG. 4 will be described during the serial output mode, and after the loading of latches $100_0$ through $100_7$. The Q output of latch $100_0$ is shown as alternating every period of the serial clock signal received at line SCLK. Since the serial output mode is selected, the T input of latch $100_1$ will follow the Q output of latch $100_0$, so that the contents of latches $100_1$ through $100_7$ will increment responsive to the Q output of latch $100_0$ making a low-to-high transition. The dashed waveform shown in FIG. 5 for the T input of latch $100_1$ illustrates the connection of the Q— output of latch $100_0$ connected thereto during serial input mode. Accordingly in serial output mode, the contents of latches $100_1$ through $100_7$ increment a full period of the serial clock signal ahead of when they would increment in serial input mode (i.e., without the pipeline feature described herein).

During the serial output stream, since both lines S1 and LDEN are low, Or gate 200 is responsive to the output of AND gate 202. AND gate 202 has a high output during such time as the Q— output of latch $100_0$ is high ($Q100_0$ in FIG. 5 being low, accordingly) and the serial clock signal on line SCLK is high. A high output from OR gate 200 turns pass transistors 114 on, connecting the selected pair of bits from data register 8 to latch 112. After the serial clock signal at line SCLK returns low, pass transistors 114 are turned off, and latch 112 is then isolated from data register 8. As discussed above, during such time as the Q output of latch $100_0$ is high, the T input to latch $100_1$ has made a low-to-high transition so that the seven most significant bits of counter 22 are incremented, and decoded by predecoder 108 and serial decoder 10. This is occurring during such time as the second bit of the prior selected pair (e.g. BIT 1 in FIG. 5) is appearing at the output. Since the output of OR gate 200 is low at this time, pass transistors 114 isolate latch 112 from data register 8 so that the data being output is not disturbed upon the completion of the decoding of the incremented contents of latches $100_1$ through $100_7$, which occurs during this period of the serial clock signal at terminal SCLK. Upon the next low-to-high transition of the serial clock signal at terminal SCLK, the output of OR gate 200 goes high so that pass transistors 114 communicate the next group of two bits selected in data register 8 to latch 112, with the Q_ output of latch $100_0$ selecting the first bit of the two via multiplexer 124 for output, shown as BIT 0' in FIG. 5.

During serial input, as in the embodiment of FIG. 2, the pipelined decoding is preferably defeated so that, in this example, the second bit of input data is not written two bits ahead of the desired location. Accordingly, line SI will cause multiplexer 102 to connect the Q and Q_ outputs of latch $100_0$ to the T_ and T inputs of latch $100_1$, respectively, in the same manner as the others of latches $100_n$. In addition, since the decoding will be occurring consistently with the input data, line SI will, via OR gate 200, cause pass transistors 114 to remain conductive throughout the serial input operation.

Also similarly with the embodiment of FIG. 2, potential ambiguities which would otherwise arise during the loading of new contents into latches $100_0$ through $100_7$ are avoided by the architecture of FIG. 4. During such loading, when line LDEN is at a high logic level, multiplexer 102 connects the Q and Q_ outputs of latch $100_0$ to the T_ and T inputs of latch $100_1$, respectively, in the same manner as the others of latches $100_n$. In this way, the early incrementing of the state of latch $100_1$ will not disrupt the first output bit from data register 8. In addition, OR gate 200 will turn on pass transistors 114 responsive to line LDEN being high, so that the pair of bits selected by the new contents of counter 22 will be directly communicated to latch 112. After line LDEN returns low, operation continues as described above relative to FIG. 5.

It should be noted that the features of the embodiments described herein will of course be applicable to various architectures of the serial side of dual-port memory 1, such as split data registers 8. The split data registers 8 allow transfers between one of the split data registers 8 and transfer gates 4 during the serial output from the other of the split data registers 8, such output utilizing the pipelining disclosed herein.

Although the invention has been described with reference to illustrative embodiments, it is to be understood that this description is by way of example only, and is not intended to be construed in a limiting sense. It is to be further understood that numerous changes in the details of the illustrative embodiments, and additional embodiments of the invention, will be apparent to, and may be made by, persons skilled in the art having reference to this description. In addition, it is to be further understood that those skilled in the art may readily substitute present and future equivalent components for those described herein, in order to achieve the same result as the illustrative embodiments. It is contemplated that such changes, substitutions and additional embodiments are within the spirit and scope of the invention as hereinafter claimed.

We claim:

1. A memory circuit of the type which stores binary data among a plurality of cell locations arranged in rows and columns, said circuit comprising:
    a data register into which the contents of a plurality of cell locations in a row are transferable and simultaneously storable among a plurality of register locations;
    counting means for sequentially selecting groups of register locations for outputting data from the register in groups, each data group corresponding to the contents of a group of register locations;
    a latch coupled to sequentially receive data groups from corresponding groups of register locations according to data selection with said counting means;
    intermediate data lines for effecting sequential transfer of data groups from the register to the latch;
    a multiplexer for serially outputting data stored in the latch; and
    circuitry for isolating a first of the groups of data when present on the intermediate data lines from the latch while a second of the groups of data is being serially output from the latch.

2. The memory circuit of claim 1 wherein a portion of said counting means controls multiplexer operation for serial transfer of data stored in the latch according to a counting sequence.

3. The memory circuit of claim 2 wherein said counting means is responsive to a single serial clock signal for incrementing.

4. The memory circuit of claim 2 wherein said counting means comprises a single counter under the control of a single serial clock signal, said counter arranged into:
    a most significant portion for sequentially outputting data groups from the register; and
    a least significant portion for controlling multiplexer operation.

5. The memory circuit of claim 1 further including logic circuitry for selectively controlling the isolating circuitry to either;
    isolate the first of the groups of data when present on the intermediate data lines from the latch while the second of the groups of data is being serially output from the latch; or
    transfer the first of the groups of data when present on the intermediate data lines to the latch.

6. The memory circuit of claim 1 wherein each group of data includes four bits of information.

7. The memory circuit of claim 1 wherein each group of data includes four bits of information and the latch is capable of simultaneously storing four bits of data.

8. The memory circuit of claim 1 formed as a dual-port device with eight random access input/output lines and eight arrays of memory cells each organized into a plurality of rows and columns, said circuit comprising a data register for each array with each data register capable of simultaneously storing all of the data in a row of an array.

9. The circuit of claim 8 wherein each array includes 512 rows and 256 columns to provide one megabit of data storage.

* * * * *